United States Patent
Ham

(10) Patent No.: US 10,088,530 B2
(45) Date of Patent: Oct. 2, 2018

(54) SLAVE MODULE FOR MONITORING ELECTRIC SYSTEM

(71) Applicant: LSIS CO., LTD., Gyeonggi-do (KR)

(72) Inventor: Sung-Sik Ham, Gyeonggi-do (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 31 days.

(21) Appl. No.: 15/399,394

(22) Filed: Jan. 5, 2017

(65) Prior Publication Data
US 2017/0276737 A1 Sep. 28, 2017

(30) Foreign Application Priority Data
Mar. 25, 2016 (KR) .................. 10-2016-0036199

(51) Int. Cl.
*G01R 31/40* (2014.01)
*H02J 13/00* (2006.01)
*G01R 31/02* (2006.01)
*H04L 12/40* (2006.01)

(52) U.S. Cl.
CPC .......... *G01R 31/40* (2013.01); *G01R 31/024* (2013.01); *H02J 13/0062* (2013.01); *H04L 12/40* (2013.01); *Y02E 60/7838* (2013.01); *Y04S 40/124* (2013.01)

(58) Field of Classification Search
CPC ... G01R 31/40; G01R 31/024; H02J 13/0062; H04L 12/40; Y02E 60/7838; Y04S 40/124
USPC ...... 324/500, 764.01, 508–511, 771, 757.01, 324/762.06, 639; 370/329, 219, 395.3, 370/503, 256, 521, 311, 229
See application file for complete search history.

(56) References Cited

U.S. PATENT DOCUMENTS

2006/0244570 A1* 11/2006 Leung .................. H02J 1/08
363/72
2007/0040657 A1 2/2007 Fosler et al.
2011/0019225 A1* 1/2011 Jung .................. B41J 29/393
358/1.15

(Continued)

FOREIGN PATENT DOCUMENTS

JP 2002-152972 A 5/2002
JP 2015-23742 A 2/2015

(Continued)

OTHER PUBLICATIONS

European Search Reports dated Apr. 21, 2017 in connection with the counterpart European Patent Application No. 16204078.6.

*Primary Examiner* — Melissa Koval
*Assistant Examiner* — Trung Nguyen
(74) *Attorney, Agent, or Firm* — K&L Gates LLP

(57) ABSTRACT

Disclosed herein is a slave module for monitoring an electric system. The slave module includes: a data transmitting/receiving unit configured to receive request data from the master module and transmit response data to the master module via the serial bus; a data converting unit configured to convert the request data into first digital data and convert second digital data into the request data; a determining unit configured to determine whether the serial bus is in inactive state based on the first digital data and the second digital data; and a data processing unit configured to transmit emergency data to the master module if it is determined that the serial bus is in the inactive state.

5 Claims, 4 Drawing Sheets

(56) References Cited

U.S. PATENT DOCUMENTS

2011/0158244 A1   6/2011  Long et al.
2015/0103845 A1   4/2015  Wu et al.

FOREIGN PATENT DOCUMENTS

KR      10-0724496 B1   5/2007
KR      10-0813799 B1   3/2008

* cited by examiner

- Prior Art -

SLAVE MODULE FOR MONITORING ELECTRIC SYSTEM

CROSS REFERENCE TO RELATED APPLICATION

This application claims the benefit of Korean Patent Application No. 10-2016-0036199, filed on Mar. 25, 2016, entitled "SLAVE MODULE FOR MONITORING ELECTRIC SYSTEM", which is hereby incorporated by reference in its entirety into this application.

BACKGROUND

1. Technical Field

The present disclosure relates to a slave module for monitoring an electric system.

2. Description of the Related Art

Electronic devices installed in substations, power stations, etc. measure and monitor the operation state and the quantity of electricity of a variety of devices used in switchgears. In addition, the electronic devices installed in substations, power stations, etc. may perform protection function including shutting off a line in case of an accident as well as control function.

To efficiently operate an electric system, an electronic device incorporated in a power device is operated in such a manner that a master module sends request data to a slave module, and then the slave module sends response data in response to the request data. When an abnormal situation takes place in the system or a device or when a fault occurs in a system line, such functionality provides important information for determining the order that all information is generated and for determining the cause of the fault.

In particular, when a fault such as grounding, overload, short-circuit, etc. takes place in a line of a power system, the fault prevails instantly such that all power installations in the system may be affected. Therefore, when a fault such as grounding, overload, short-circuit, etc. takes place in a line of a power system, it is necessary to quickly transmit such data to the master module to repair the fault.

FIG. 1 is a diagram showing existing slave modules 11, 12 and 13 for monitoring an electric system and an existing master module 20 connected thereto via a serial bus. The operation of the existing slave modules 11, 12 and 13 and the existing master module 20, and the problems will be described in detail below with reference to FIG. 1.

Initially, the master module 20 sends request data to the slave modules 11, 12 and 13 via the serial bus. Then, the slave modules 11, 12 and 13 send response data via the serial bus only when they receive the request data. The request data and the response data are transmitted/received in a so-called round-robin scheme, i.e., repeatedly in the order that the slave modules 11, 12 and 13 are arranged.

In the existing round-robin scheme, however, it is not possible to determine whether there is a carrier in the serial bus, and thus collision between data may occur. In addition, in the existing round-robin scheme, as data is transmitted/received in the order that the slave modules 11, 12 and 13 are arranged, when emergency data is generated, it cannot be transmitted first. Moreover, in the existing round-robin scheme, as the slave modules 11, 12 and 13 send response data only when they have received request data, it takes a long time for the master module 20 to acquire data.

SUMMARY

It is an object of the present disclosure to provide a slave module for monitoring an electric system that can determine whether a serial bus is in inactive state by monitoring a carrier in the serial bus.

It is another object of the present disclosure to provide a slave module for monitoring an electric system that can reduce a time taken to acquire data by a master module by transmitting emergency data to the master module if the serial bus is in inactive state.

It is yet another object of the present disclosure to provide a slave module for monitoring an electric system that can utilize a serial bus efficiently by transmitting emergency data to the master module if the serial bus is in inactive state.

It is still another object of the present disclosure to provide a slave module for monitoring an electric system that can prevent data collision in a serial bus by monitoring a carrier in the serial bus.

Objects of the present disclosure are not limited to the above-described objects and other objects and advantages can be appreciated by those skilled in the art from the following descriptions. Further, it will be easily appreciated that the objects and advantages of the present disclosure can be practiced by means recited in the appended claims and a combination thereof.

In accordance with one aspect of the present disclosure, a slave module for monitoring an electric system transmits data to a master module via a serial bus and includes: a data transmitting/receiving unit configured to receive request data from the master module and transmit response data to the master module via the serial bus; a data converting unit configured to convert the request data into first digital data and convert second digital data into the request data; a determining unit configured to determine whether the serial bus is in inactive state based on the first digital data and the second digital data; and a data processing unit configured to transmit emergency data to the master module if it is determined that the serial bus is in the inactive state.

According to an exemplary embodiment of the present disclosure, it is possible to determine whether the serial bus is in the inactive state by monitoring a carrier in the serial bus.

In addition, according to an exemplary embodiment of the present disclosure, if the serial bus is in the inactive state, emergency data is transmitted to the master module such that the time taken to acquire data by the master module can be reduced.

In addition, according to an exemplary embodiment of the present disclosure, if the serial bus is in the inactive state, emergency data is transmitted to the master module such that the serial bus can be utilized efficiently.

In addition, according to an exemplary embodiment of the present disclosure, it is possible to prevent data collision in the serial bus by monitoring a carrier in the serial bus.

DETAILED DESCRIPTION

Figure 1:
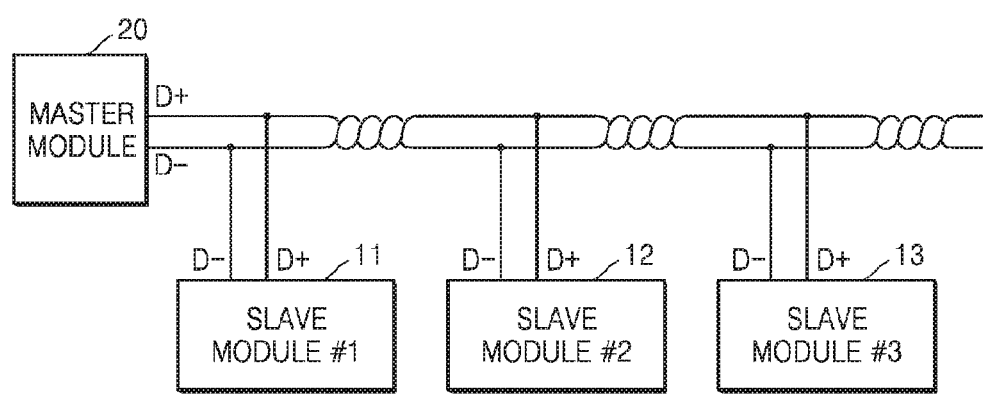
FIG. 1 is a diagram showing existing slave modules for monitoring an electric system and an existing master module connected thereto via a serial bus.

The above objects, features and advantages will become apparent from the detailed description with reference to the accompanying drawings. Embodiments are described in sufficient detail to enable those skilled in the art in the art to easily practice the technical idea of the present disclosure. Detailed descriptions of well known functions or configurations may be omitted in order not to unnecessarily obscure the gist of the present disclosure. Hereinafter, embodiments of the present disclosure will be described in detail with reference to the accompanying drawings. Throughout the drawings, like reference numerals refer to like elements.

Figure 2:
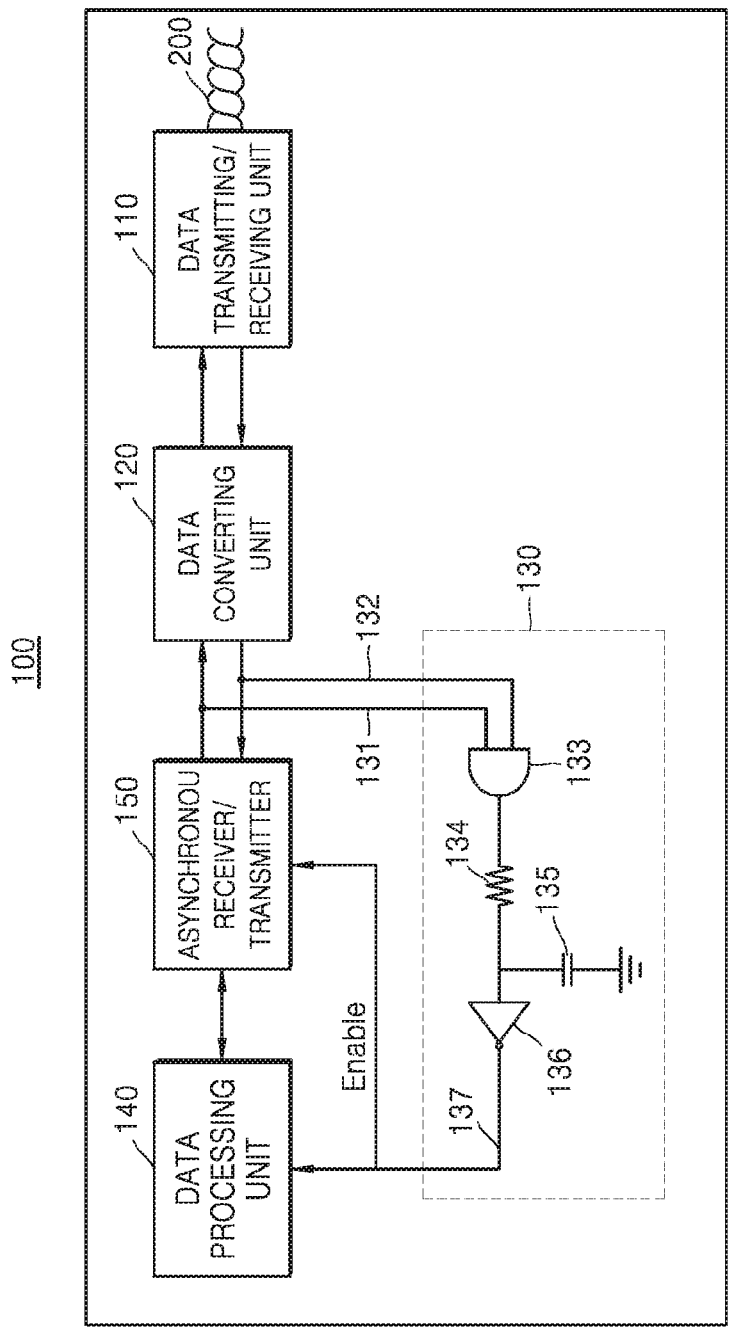
FIG. 2 is a diagram showing a slave module for monitoring an electric system according to an exemplary embodiment of the present disclosure.

FIG. 2 is a diagram showing a slave module 100 for monitoring an electric system according to an exemplary embodiment of the present disclosure. Referring to FIG. 2, the slave module 100 for monitoring an electric system according to the exemplary embodiment of the present disclosure may include a data transmitting/receiving unit 110, a data converting unit 120, a determining unit 130, a data processing unit 140, and an asynchronous receiver/transmitter 150. The slave module 100 for monitoring an electric system shown in FIG. 2 is merely an exemplary embodiment of the present disclosure, and the elements are not limited to those shown in FIG. 2. Some elements may be added, modified or eliminated as desired.

Figure 3:
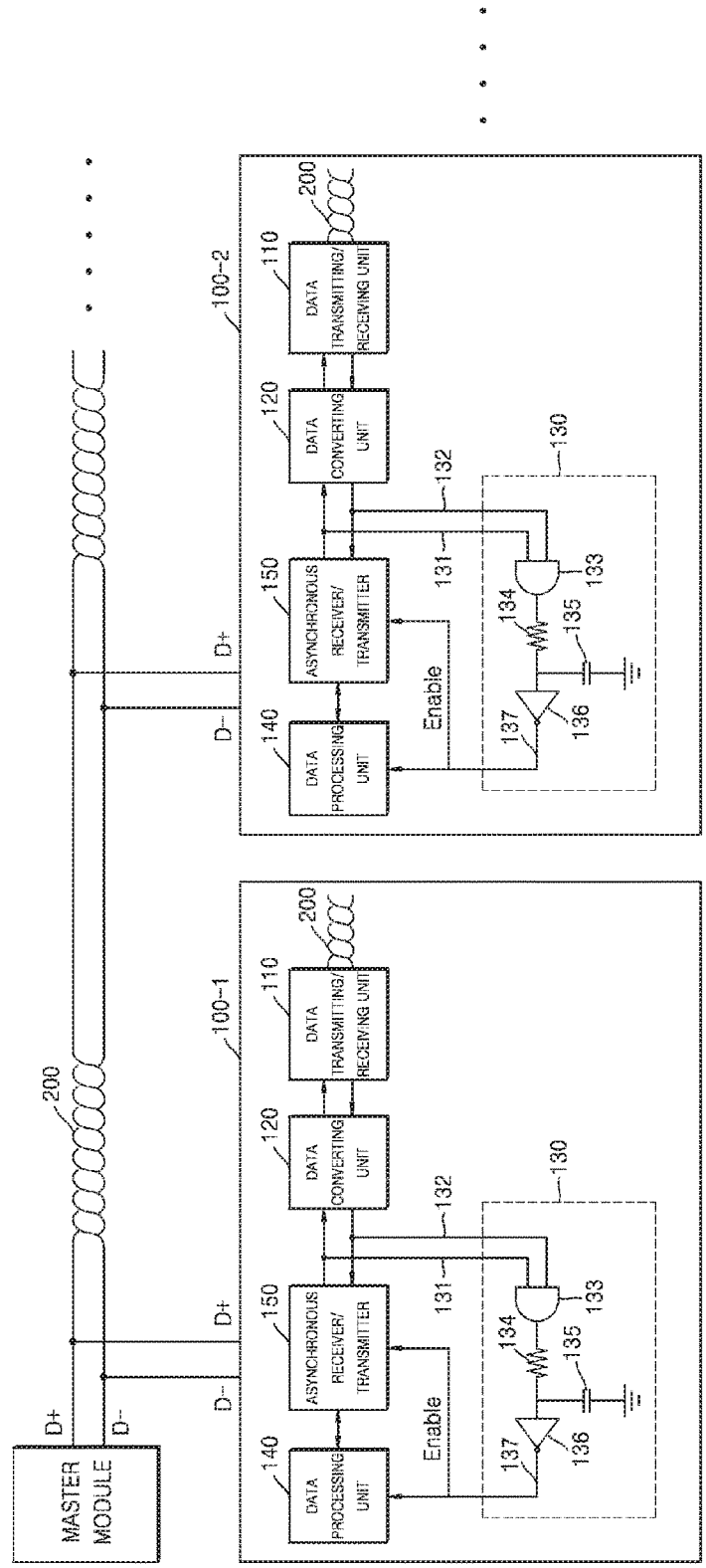
FIG. 3 is a diagram showing a slave module for monitoring an electric system according to an exemplary embodiment of the present disclosure connected to a master module via, a serial bus.
Figure 4:
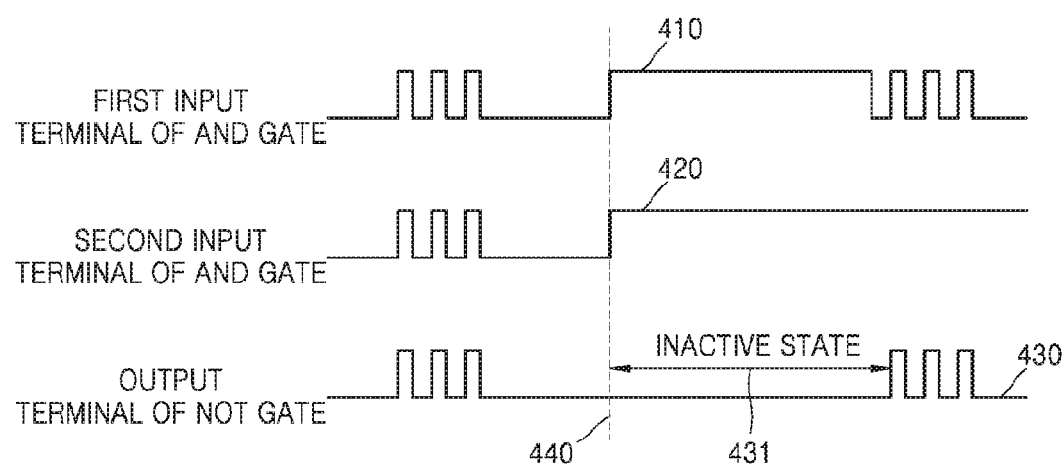
FIG. 4 is a diagram showing signals input to input terminals of an AND gate, respectively, and a signal output from an output terminal of a NOT gate according to an exemplary embodiment of the present disclosure.

FIG. 3 is a diagram showing a slave module 100 for monitoring an electric system according to an exemplary embodiment of the present disclosure connected to a master module via a serial bus 200. FIG. 4 is a diagram showing signals 410 and 420 input to input terminals 131 and 132 of an AND gate, respectively, and a signal 430 output from an output terminal 137 of a NOT gate according to an exemplary embodiment of the present disclosure. Hereinafter, the slave module 100 for monitoring an electric system according to the exemplary embodiment of the present disclosure will be described in detail with reference to FIGS. 2 to 4.

Initially, referring to FIGS. 2 and 3, slave modules 100-1 and 100-2 for monitoring an electric system and a master module may transmit/receive data. Data may be transmitted/received either in the order that the slave modules 100-1 and 100-2 are arranged or in an arbitrary order. If emergency data is generated in a slave module, the slave module may transmit/receive data first.

Referring again to FIG. 2, the data transmitting/receiving unit 110 may receive request data from the master module via a serial bus 200 and may transmit response data to the master module. The serial bus 200 is a path via which data is transmitted/received. The master module is a device controlling at least one slave module 100.

The request data is transmitted from the master module to the slave module 100 for monitoring an electric system so as to request response data from the slave module 100. The response data is transmitted from the slave module 100 to the master module in response to the request data from the master module. The request data and the response data are a kind of carrier transmitted/received via the serial bus 200.

It is to be noted that the carrier transmitted/received via the serial bus 200 is not limited to the request data or the response data.

The request data and the response data may be transmitted/received directly by the data transmitting/receiving unit 110 or transmitted/received by the data processing unit 140. In addition, the request data and the response data may be transmitted/received via the asynchronous receiver/transmitter, the data converting unit 120 and the data transmitting/receiving unit 110, which will be described in detail below.

The data converting unit 120 may convert the request data into first digital data 410 and may convert second digital data 420 into the response data. According to an exemplary embodiment of the present disclosure, it is possible to determine whether the serial bus 200 is in inactive state 431 by converting the request data into the first digital data 410.

The determining unit 130 may determine whether the serial bus 200 is in inactive state 431 based on the first digital data 410 and the second digital data 420. In addition, the determining unit 130 may determine that the serial bus 200 is in inactive state 431 if the first digital data 410 and the second digital data 420 are at high level.

The inactive state refers to a state in which no request data or no response data is transmitted/received via the serial bus 200.

The first digital data 410 is a signal that is input to a first input terminal 131 of an AND gate 133. The first digital data 410 alternates between high level and low level depending on whether there is a carrier transmitted from the slave module 100 for monitoring an electric system to the master module. If there is no carrier transmitted from the slave module 100 to the master module, the first digital data 410 remains at high level.

The second digital data 420 is a signal that is input to a second input terminal 132 of the AND gate 133. The second digital data 420 alternates between high level and low level depending on whether there is a carrier transmitted from the master module to the slave module 100. Like the first digital data 410, the second digital data 420 also remains at high level if there is no carrier transmitted from the master module to the slave module 100.

Referring to FIGS. 2 and 4, the first digital data 410 is input to the first input terminal 131 of the AND gate 133, and the second digital data 420 is input to the second input terminal 132 of the AND gate 133. The first digital data 410 remains at high level after time 440 since there is no carrier transmitted from the slave module 100 to the master module. The second digital data 420 also remains at high level after time 440 since there is no carrier transmitted from the master module to the slave module 100.

When the first digital data 410 and the second digital data 420 become high level, they have the value of one and accordingly the AND gate 133 may output the digital value of one. When the AND gate 133 outputs the value of one, a NOT gate 136 inverts it into zero to output it, as indicated by the signal 430 shown in FIG. 4. When the NOT gate 136 outputs the value of zero, the determining unit 130 may determine that the serial bus 200 is in the inactive state 431. When the serial bus 200 is in the inactive state 431, the data processing unit 140 sends emergency data to the master module, which will be described in detail below.

According to an exemplary embodiment of the present disclosure, the determining unit 130 may adjust timing of transmitting the emergency data by using a capacitor 135 and a resistor 134. More specifically, since the multiple of capacitance and resistance is a time constant, the determining unit 130 may adjust the timing of outputting the value from the NOT gate 136 by adjusting the time constant. That is, when the NOT gate 136 outputs the output value form zero, the data processing unit 140 transmits emergency data, and the determining unit 130 may adjust the output timing of the NOT gate 136 to thereby adjust the timing of transmitting the emergency data.

If it is determined that the serial bus 200 is in the inactive state 431, the data processing unit 140 may transmit the emergency data to the master module. The emergency data refers to data that has to be transmitted from the slave module 100 to the master module first, irrespectively of the order that the slave modules are arranged. The data processing unit 140 may transmit response data directly to the master module as well as the emergency data and may receive request data directly from the master module.

According to an exemplary embodiment of the present disclosure, the data processing unit 140 may transmit the emergency data to the master module via the asynchronous receiver/transmitter 150, the data converting unit 120 and the data transmitting/receiving unit 110. The emergency data may also be transmitted directly from the asynchronous receiver/transmitter 150 to the master module, which will be described in detail below.

The asynchronous receiver/transmitter 150 may convert the first digital data into first serial data to transmit it to the data processing unit 140 and may receive second serial data from the data processing unit 140 to convert it into second digital data. The asynchronous receiver/transmitter 150 may be a universal asynchronous receiver/transmitter (UART). Therefore, serial data refers to data that is transmitted a bit at a time.

The asynchronous receiver/transmitter 150 is a kind of computer hardware that converts parallel data into serial data to transmit it and is typically used with communications standard such as EIA RS-232, RS-422, RS-485, etc. The asynchronous receiver/transmitter 150 may configure the form of document or transmission rate by itself or may be controlled by a driver circuit.

According to an exemplary embodiment of the present disclosure, if it is determined that the serial bus 200 is in the inactive state, the asynchronous receiver/transmitter 150 may be turned on to receive emergency data from the data processing unit 140 and then may transmit the emergency data to the master module. Referring to FIGS. 2 and 4, when zero is output from an output terminal 137 of the NOT gate 136, the determining unit 130 determines that the serial bus 200 is in the inactive state, and the asynchronous receiver/transmitter 150 is turned on. When the determining unit 130 determines that the serial bus is in the inactive state, the data processing unit 140 transmits the emergency data via the asynchronous receiver/transmitter 150. At this time, the asynchronous receiver/transmitter 150 may be turned on to prevent the collision. In addition, the asynchronous receiver/transmitter 150 transmits the emergency data while the data processing unit 140 is processing data, thereby allowing the slave module 100 to transmit data spontaneously in a short period of time.

As set forth above, according to an exemplary embodiment of the present disclosure, it is possible to determine whether the serial bus is in the inactive state by monitoring a carrier in the serial bus. In addition, according to an exemplary embodiment of the present disclosure, if the serial bus is in the inactive state, emergency data is transmitted to the master module such that the time taken to acquire data by the master module can be reduced.

In addition, according to an exemplary embodiment of the present disclosure, if the serial bus is in the inactive state, emergency data is transmitted to the master module such that the serial bus can be utilized efficiently. In addition, according to an exemplary embodiment of the present disclosure, it is possible to prevent data collision in the serial bus by monitoring a carrier in the serial bus.

The present disclosure described above may be variously substituted, altered, and modified by those skilled in the art to which the present invention pertains without departing from the scope and sprit of the present disclosure. Therefore, the present disclosure is not limited to the above-mentioned exemplary embodiments and the accompanying drawings.

What is claimed is:

1. A slave module for monitoring an electric system, the slave module transmitting data to a master module via a serial bus, the slave module comprising:
    a data transmitting/receiving unit configured to receive request data from the master module and transmit response data to the master module via the serial bus;
    a data converting unit configured to convert the request data into first digital data and convert second digital data into the request data;
    a determining unit configured to determine whether the serial bus is in an inactive state based on the first digital data and the second digital data, wherein the determining unit determines that the serial bus is in the inactive state if the first digital data and the second digital data are at a high level; and
    a data processing unit configured to transmit emergency data to the master module if it is determined that the serial bus is in the inactive state.

2. The slave module of claim 1, wherein the determining unit adjusts timing of transmitting the emergency data by using a capacitor and a resistor.

3. The slave module of claim 1, further comprising:
    an asynchronous receiver/transmitter configured to convert the first digital data into first serial data to transmit it to the data processing unit, and to receive second serial data from the data processing unit to convert it into the second digital data.

4. The slave module of claim 3, wherein the data processing unit transmits the emergency data to the master module via the asynchronous receiver/transmitter, the data converting unit and the data transmitting/receiving unit.

5. The slave module of claim 3, wherein the asynchronous receiver/transmitter is turned on if it is determined that the serial bus is in the inactive state, and receives the emergency data from the data processing unit and then transmits the emergency data to the master module.

* * * * *